(12) United States Patent
Volke et al.

(10) Patent No.: US 7,248,049 B2
(45) Date of Patent: Jul. 24, 2007

(54) HIGH RESOLUTION NMR PROBE HEAD FOR SMALL SAMPLE VOLUMES AND METHOD FOR OPERATING THE SAME

(75) Inventors: Frank Volke, St. Ingbert (DE); Martin Benecke, Homberg (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 0 days.

(21) Appl. No.: 10/520,163

(22) PCT Filed: Jul. 1, 2003

(86) PCT No.: PCT/DE03/02184

§ 371 (c)(1),
(2), (4) Date: Jan. 4, 2005

(87) PCT Pub. No.: WO2004/005952

PCT Pub. Date: Jan. 15, 2004

(65) Prior Publication Data

US 2006/0012368 A1    Jan. 19, 2006

(30) Foreign Application Priority Data

Jul. 5, 2002    (DE) ................. 102 30 196

(51) Int. Cl.
*G01V 3/00* (2006.01)
(52) U.S. Cl. ...................... 324/321; 324/318
(58) Field of Classification Search ............ None
See application file for complete search history.

(56) References Cited

U.S. PATENT DOCUMENTS

| | | | |
|---|---|---|---|
| 3,512,078 A | 5/1970 | Hall | |
| 4,859,949 A * | 8/1989 | McKenna | 324/321 |
| 5,146,166 A | 9/1992 | Bartuska | |
| 5,237,276 A | 8/1993 | Cory | |
| 5,397,989 A | 3/1995 | Spraul et al. | |
| 5,420,508 A | 5/1995 | Smith | |
| 5,534,780 A * | 7/1996 | Lilly | 324/321 |
| 5,635,840 A | 6/1997 | Horigane et al. | |
| 5,876,338 A * | 3/1999 | Gilderdale et al. | 600/411 |
| 6,479,994 B1 * | 11/2002 | Hills et al. | 324/306 |
| 6,686,740 B2 * | 2/2004 | Tschirky et al. | 324/321 |
| 6,768,305 B1 * | 7/2004 | Keifer | 324/321 |
| 6,888,352 B2 * | 5/2005 | Okada et al. | 324/321 |
| 6,897,657 B2 * | 5/2005 | Okada et al. | 324/321 |
| 7,026,817 B2 * | 4/2006 | Okada et al. | 324/321 |
| 7,046,007 B2 * | 5/2006 | Okada et al. | 324/321 |

(Continued)

FOREIGN PATENT DOCUMENTS

EP    0 516 111 A1    12/1992

*Primary Examiner*—Brij Shrivastav
*Assistant Examiner*—Tiffany A. Fetzner
(74) *Attorney, Agent, or Firm*—Breiner & Breiner, LLC

(57) ABSTRACT

A probe head for NMR measurements as well as a method of operating this probe head is disclosed. The probe head includes a support body that carries a solenoid coil as measuring coil, as well as a feed line towards the solenoid coil, via which a sample material can be introduced into a measuring volume surrounded by the solenoid coil. The feed line is configured for receiving and conveying sample containers in the probe head. The probe head allows for an automated measurement of different samples, specifically of solid samples.

14 Claims, 1 Drawing Sheet

U.S. PATENT DOCUMENTS

| | | |
|---|---|---|
| 7,064,548 B2 * | 6/2006 | Aptaker et al. ............. 324/318 |
| 7,187,173 B1 * | 3/2007 | Raftery et al. ............. 324/318 |
| 7,190,167 B2 * | 3/2007 | Okada et al. ............... 324/321 |
| 2002/0196022 A1 * | 12/2002 | Tschirky et al. ............ 324/321 |
| 2003/0076103 A1 * | 4/2003 | Okada et al. ............... 324/321 |
| 2003/0076104 A1 * | 4/2003 | Okada et al. ............... 324/321 |
| 2005/0122114 A1 * | 6/2005 | Okada et al. ............... 324/321 |
| 2005/0189944 A1 * | 9/2005 | Okada et al. ............... 324/321 |
| 2006/0012368 A1 * | 1/2006 | Volke et al. ................ 324/318 |
| 2006/0089550 A1 * | 4/2006 | Kitney et al. .............. 600/410 |
| 2006/0119359 A1 * | 6/2006 | Hasegawa et al. .......... 324/318 |
| 2006/0186886 A1 * | 8/2006 | Okada et al. ............... 324/321 |
| 2007/0016003 A1 * | 1/2007 | Piron et al. ................. 600/415 |

* cited by examiner

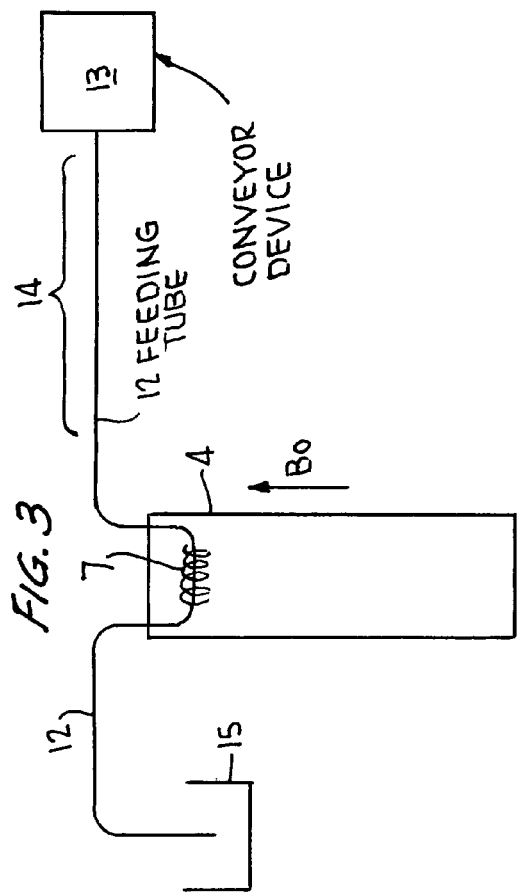
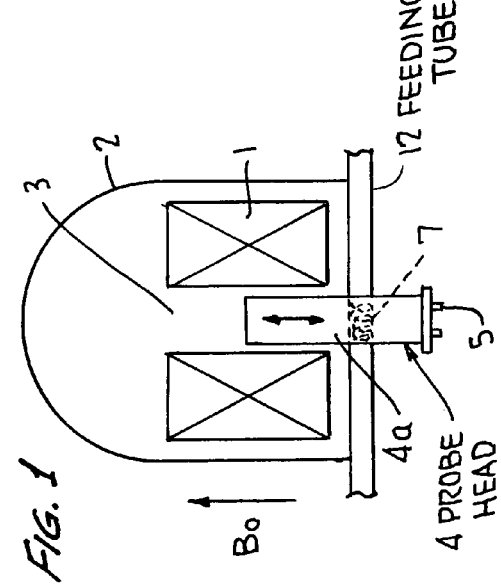
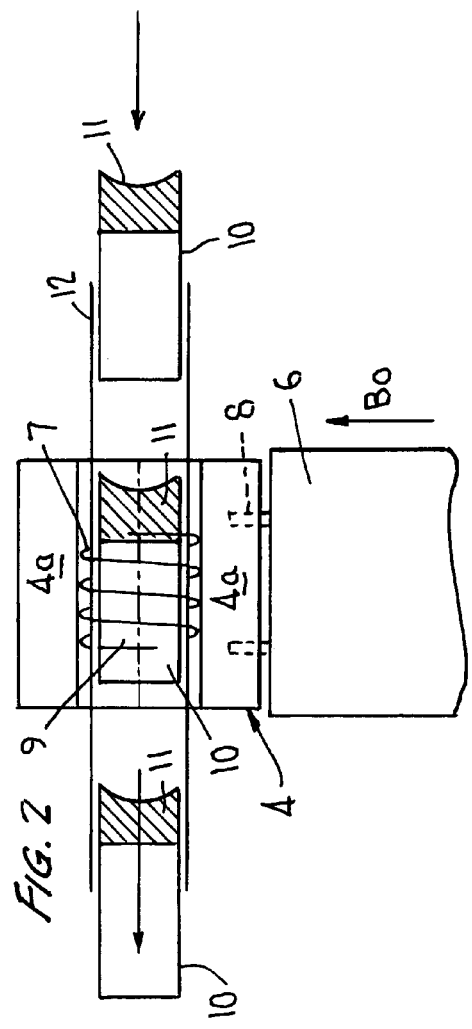

US 7,248,049 B2

HIGH RESOLUTION NMR PROBE HEAD FOR SMALL SAMPLE VOLUMES AND METHOD FOR OPERATING THE SAME

FIELD OF APPLICATION

The present invention relates to a probe head for NMR measurements, consisting of a support body carrying a solenoid coil via which a sample material can be introduced into a measuring volume surrounded by the solenoid coil. The invention moreover relates to a method of operating such a probe head.

In NMR spectroscopy, a sample in a strong static basic magnet field $B_0$ is subjected to high-frequency pulses of an HF magnetic field oriented orthogonally on the basic magnetic field and the HF pulses then emitted by the sample as measured and analysed. For the creation of basic magnetic fields as strong and homogeneous as possible, nowadays superconducting magnetic systems are frequently used. These magnetic systems are vertically arranged, as a rule, and present a central bore into which the exciting HF emitting and receiving coil with the sample is introduced. The sample is located in the measuring volume surrounded by the emitting or receiving coil, respectively. The system constituted by the sample holder, the emitting and receiving coil as well as by the corresponding electrical leads, which are disposed on or in a support body, is referred to as probe head. This probe head with the sample holder and the emitting or receiving coil, respectively, present an elongate shape adapted to the bore in the superconducting solenoid in many NMR systems. Prior to measurement, the probe head is removed from the solenoid bore, then a sample tube charged with the sample material is inserted into the sample holder, whereupon the probe head is pushed again into the bore of the solenoid. The sample tubes normally project beyond the measuring volume on both sides so that always a quantity of sample material is required that exceeds the quantity actually measured.

The German Patent DE 41 01 473 A1 discloses a probe head for liquid NMR spectroscopy, which permits an automated serial measurement of several samples. In the proposed probe head, a sample tube is clamped, which is open on both sides and which is connected to feed lines for the inflow and outflow of the liquid sample into the probe head. Due to these feed lines it is possible to supply intermittently defined volumes of a sample liquid in the so-called stop-flow technique. A continuous operation of the probe head is equally possible according to that prior art document. Due to an appropriate clamping device for the sample tube it is possible to replace the tube very rapidly so that the probe head can be operated with sample tubes having different wall thicknesses or different inside volumes, without the need to replace the probe head completely.

One disadvantage of this probe head consists, however, in the application of a saddle measuring coil as HF emitting and receiving coil because such a coil creates a homogeneous HF field only over one part of the volume surrounded by the coil. A very good HF homogeneity is, however, required specifically for the analysis of dissolved substances. A replacement of the sample tube may, moreover, result in the fact that the charging factor of the measuring coil with the new sample tube is not or no longer at an optimum. Another disadvantage of that known probe head consists in the aspect that here, too, sample quantities must be introduced which exceed the quantities that would be required for the measurement proper. When different sample materials are measured it is furthermore necessary to flush the feed lines in order to avoid intermixing of different samples.

The German Patent DE 42 34 544 C2 discloses a sample-changing system for liquid NMR spectroscopy, wherein a solenoid coil is proposed, too, as emitting and receiving coil, with the axis of the coil and of the sample tube being disposed orthogonally on the bore of the superconducting base field solenoid in the probe head. In the probe head of that device, the sample tube is equally connected to appropriate feed lines for the inflow and outflow of liquid sample material so that measurement can be carried out in the stop-flow mode or with a continuous flow. In view of the minimum sample volume and the measurement of different samples with this probe head, too, the same problems occur as those mentioned in relation to the afore-discussed prior art reference. In that system, the entire probe head must be exchanged for the measurement of samples requiring a different inside diameter of the sample tube. An automated measurement of solid samples is not possible with these two probe heads.

Starting out from that prior art, one problem underlying the present invention consists in providing a probe head as well as a method of operating the probe head, which permit the automated serial measurements of different samples in a simple manner, even with very small sample volumes. Moreover, the probe head should also permit the automated measurement of solid samples and, according to a particular embodiment, a simple optimisation of the charging factor with different sample volumes.

DESCRIPTION OF THE INVENTION

The problem is solved by the probe head as well as by the method according to the claims. Expedient embodiments of the probe head and the method can be derived from the description given below and from the embodiments.

In a manner known per se, the present probe head consists of a body carrying a solenoid coil as measuring coil and of a feed line leading to the solenoid coil, via which a sample material can be introduced into a measuring volume surrounded by the solenoid coil. The body may have an elongate configuration, for instance, in which case the coil axis of the solenoid coil is preferably oriented orthogonally on the longitudinal axis of the body. In the present probe head, the feed line leading to the solenoid coil is configured for receiving and conveying sample containers. It must therefore present a sufficient inside diameter for receiving the sample containers. Such a feed line may have a tubular configuration, for instance, is passed through the solenoid coil and consists of an NMR material at least inside the solenoid coil. The sample to be measured is then charged into a suitable sample container, is conveyed in the feed line up to the measuring volume, is measured there and is then conveyed out of the measuring volume again. The sample containers may be so selected that they receive only the minimum sample quantity that is required for the measurement. The diameter of the sample container is adapted to the inside diameter of the feed line in order to allow for unproblematic conveyance inside the feed line.

Due to this configuration of the probe head, an automated serial measurement of any sample materials whatsoever is possible in a simple manner. For instance, the sample containers may be charged with liquid, solid and also gaseous sample materials and these samples can be measured in an automated manner. The use of sample containers short along the supply direction permits also the measurement of very small sample volumes.

The solenoid coil is preferably detachably connected to the body of the probe head so that it is easy to exchange in a simple manner at any time. Due to this detachable connection of the solenoid coil to the body of the probe head, it is possible to hold a plurality of solenoid coils of different diameters available and to insert them into the probe head in the case of need. On account of the simple exchangeability, the measuring volume can be adapted easily to the respective sample volumes to be measured so that the charging factor is at an optimum and hence a very good signal-to-noise ratio will be achieved. The application of solenoid coils instead of frequently used Helmholtz-type coils or saddle coils moreover entails the advantage that the HF homogeneity is excellent throughout the sample volume in the solenoid coil. Solenoid coils are furthermore simple to produce at acceptable costs. According to the preferred embodiment of the present probe head, the connection between the solenoid coils and a connective support element is realized in the form of a plug-and-socket connector so that the coil can be exchanged merely by removal of one coil and plugging of the respectively envisaged other coil. The plug-and-socket connectors provide preferably the electrical contacts between the HF lines and the coil at the same time. The detachable connection may, of course, also be realized in another form, e.g. in the form of a clamp joint.

The feed line is preferably connected to an appropriate conveying mechanism that permits the transport of the sample containers in steps in the feed line. To this end, for instance, a plurality of sample containers may be introduced in succession into an appropriate collecting zone of the feed line prior to a measurement. This succession of sample containers is then conveyed in steps by means of the conveying mechanism in such a way that one of the sample containers is in the measuring volume at each step and can be measured there. In the next step, the respective sample container already measured is conveyed out of the measuring volume whilst the next sample container is introduced by the conveying movement into the measuring volume.

Various techniques come into question for the conveying mechanism. For instance, the sample containers may be conveyed by means of air or another suitable propelling agent in the feed line. A mechanical slide displacing the sample containers in the feed line is equally appropriate.

Due to this configuration of the present probe head it is possible to perform an automated measurement of many samples, in particular also of solid samples, within the scope of the routine operation in a large-scale laboratory. With a suitable selection of the size of the sample containers it is also possible to measure even very small sample volumes that are preferably adapted to the size of the measuring volume, which reduces hence the costs of the sample material. As small sample containers are used, which may be introduced in succession into the feed line, it becomes expediently possible to measure different samples with rapid changes, without the necessity to make provisions for laborious and expensive flushing of the feed lines to this end.

BRIEF DESCRIPTION OF THE DRAWINGS

The present invention will be briefly described again in the following by an embodiment with reference to the drawings, without any limitation of the general inventive idea. In the drawing:

FIG. 1 is a fundamental illustration of the application of an NMR probe head in a superconducting base field solenoid;

FIG. 2 illustrates a partial view of an example of the configuration of the probe head in accordance with the present invention; and FIG. 3 shows one example of the extension of the feeders in the probe head according to the present invention.

WAYS OF REALISING THE INVENTION

FIG. 1 is an exemplary view of a typical arrangement for NMR spectroscopy with a superconducting base field solenoid 1. This superconducting base field solenoid 1 is vertically disposed in a Dewar vessel 2 and presents a central bore 3 for the introduction of the sample to be measured. A very homogeneous static magnetic field $B_0$ prevails in this bore 3, whose orientation is roughly indicated in the figure. For measuring, a sample is supplied to a probe head 4, having a body 4a, that is introduced into the bore of the base field solenoid 1. This is schematically roughly indicated by the double arrow shown in FIG. 1. The probe head 4 comprises appropriate connectors 5 for the HF supply of the integrated emitting and receiving coil or for conveying the received signals on its end projecting from the base field solenoid 1. Such a probe head 4 includes normally an adapter circuit for adaptation of the probe head to the usual input resistance of 50 Ω at the input of the probe head, and includes also a waveguide resonator that is matched to the emission frequency. This component is not the subject matter of the present invention and is therefore not shown explicitly in the present embodiment. They may be configured in the same manner as in other known probe heads in a manner known to those skilled in the art.

FIG. 2 shows an example of a configuration of the inventive probe head at a scale of approximately 1:1, with this figure illustrating only the front zone of the probe head 4. The support body 6 of the probe head 4, onto which a solenoid coil is plugged, can be recognised in this front zone located in the centre of the bore 3 of the superconducting base field solenoid during the measuring cycle. The plug-and-socket connector 8 is roughly indicated merely schematically in this figure. The measuring volume 9 enclosed by the solenoid coil 7 is determined by the diameter of the coil 7 as well as by the coil's longitudinal extension. A set of several solenoid coils 7 of different lengths and diameters can be held available for varying the dimensions of this measuring volume 9, which coils can be plugged onto the support body 6 in the same manner. The solenoid coil 7 on the probe head 4 can be simply exchanged in this manner on the probe head 4 and may be matched to the respective dimensions of the sample volumes in order to achieve an optimum charging factor.

The sample materials are charged into sample containers 10 consisting, in the present example, of short small tubes of a material not interfering with the NMR measurement, which can be closed in a water-tight and air-tight manner by means of a plug 11 made of Teflon, for instance. In the present example, a feeding tube or feed line 12 of appropriate diameter is passed through the solenoid coil for conveying these sample containers 10, in which tube the sample containers 10 can be conveyed. This configuration permits the introduction of a great number of sample containers 10 with different samples into the tube and the conveyance of the sample container 10 out of the solenoid coil 7 by means of an air flow after each measurement of a specific sample, i.e. a sample in one of the sample containers 10, as well as the introduction of the next sample in the respective sample container 10. It is also possible to use a liquid as conveying agent, for instance in an approach to achieve the matching of susceptibility in the measuring volume 9.

Compared against conventional sample exchangers, wherein individual small NMR tubes are vertically introduced into the NMR probe head, this possibility of automatic sample change incurs substantially lower costs and is sturdier. In particular, several sample containers 10 with different samples can be introduced into an appropriate collector section 14 of the feeding tube 12 with the present configuration of the probe head or the present method, respectively, from which collector section the sample containers 10 are then conveyed in steps through the measuring volume 9. The orientation of the magnetic field is indicated by the arrow $B_0$ in FIG. 3.

FIG. 3 illustrates an example of the extension of the feeding tube 12 of the probe head 4, with the solenoid coil 7 being roughly indicated at the front end of the probe head 4. The feeding tube 12 is connected to a conveyor device 13 that conveys the sample containers 10, which are initially introduced in succession in a collector section 14 between the conveyor device 13 and the probe head 4, for measurement through the measuring volume of the probe head 4. The probe head 4 need not be taken out of the bore 3 of the superconducting base field solenoid 1 to this end. The samples already measured are output into an appropriate collector station 15 at the other end of the feeding tube 12. The orientation of the magnetic field is indicated by the arrow $B_0$ in FIG. 3.

List of Reference Numerals

| | |
|---|---|
| 1 | superconducting base field solenoid |
| 2 | Dewar vessel |
| 3 | bore in the base field solenoid |
| 4 | probe head |
| 5 | connectors of the probe head |
| 6 | support body |
| 7 | solenoid coil |
| 8 | plug-and-socket connector |
| 9 | measuring volume |
| 10 | sample containers |
| 11 | plug |
| 12 | tube |
| 13 | conveyor device |
| 14 | collector section |
| 15 | collector station |

The invention claimed is:

1. Probe head configured for NMR measurements in a magnetic system, said magnetic system comprising a bore extending in parallel with a base magnetic field for receiving the probe head through a lower opening thereof, wherein the probe head includes a body carrying inside said body at least one solenoid coil as a measuring coil, said solenoid coil having a coil axis perpendicular to the base magnetic field when inserted into said bore through said lower opening, a feed line towards the solenoid coil via which a sample material can be introduced into a measuring volume surrounded by said solenoid coil, wherein said feed line is configured in relation to said measuring volume for receiving and conveying sample containers through said measuring volume by extending along said coil axis perpendicular to the direction of said lower opening in said bore of said magnetic system.

2. Probe head according to claim 1, wherein said body of said probe head containing said at least one solenoid coil is detachably connected to a connective support element.

3. Probe head according to claim 2, wherein said connective support element and said body of said probe head containing said at least one solenoid coil are detachably connected by a plug-and-socket connector.

4. Probe head according to claim 1, wherein said feed line is configured for receiving a plurality of sample containers disposed in succession.

5. Probe head according to claim 1, wherein said feed line is connected to a conveying mechanism that permits stepwise conveyance of said sample containers in said feed line.

6. Probe head according to claim 5, wherein said conveying mechanism provides said conveyance by pressing a propelling agent into said feed line.

7. Probe head according to claim 1, wherein said sample containers are constructed and arranged for complete introduction into said measuring volume.

8. Probe head according to claim 1, wherein said sample containers are constructed and arranged for receiving a maximum sample volume of $=<1$ ml.

9. Probe head according to claim 1, wherein said feed line is passed from a receiving opening in said body of said probe head for said sample containers through said measuring volume to a discharge opening in said body of said probe head for said sample containers.

10. Probe head according to claim 1, wherein said feed line is of a tubular configuration.

11. Probe head according to claim 1, further comprising a plurality of solenoid coils of different size which are detachably connected to said support body in alternation.

12. Method of operating the probe head according to any one of claims 1-11, comprising charging the sample material into a sample container, introducing said sample container into said feed line and conveying in said feed line in a conveying direction to said measuring volume, and, after measurement, conveying via said feed line along the conveying direction said sample container out of said measuring volume.

13. Method of operating the probe head according to any one of claims 1-11, comprising charging the sample material into a sample container, introducing said sample container into said feed line and conveying in said feed line in a conveying direction to said measuring volume, and, after measurement, conveying via said feed line along the conveying direction said sample container out of said measuring volume, wherein said sample container is conveyed by a propelling agent in said feed line.

14. Method of operating the probe head according to any one of claims 1-11, comprising charging the sample material into a sample container, introducing said sample container into said feed line and conveying in said feed line in a conveying direction to said measuring volume, and, after measurement, conveying via said feed line along the conveying direction said sample container out of said measuring volume, wherein a plurality of said sample containers containing same or different sample materials are introduced in succession into said feed line and are subsequently conveyed together in steps in said feed line for measuring each in succession.

* * * * *